(12) United States Patent
Wang (10) Patent No.: US 11,686,765 B2
(45) Date of Patent: Jun. 27, 2023

(54) DIE EXTRACTION METHOD

(71) Applicant: CHANGXIN MEMORY TECHNOLOGIES, INC., Hefei (CN)

(72) Inventor: Kun Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 95 days.

(21) Appl. No.: 17/455,973

(22) Filed: Nov. 22, 2021

(65) Prior Publication Data

US 2022/0128627 A1    Apr. 28, 2022

Related U.S. Application Data (63) Continuation of application No. PCT/CN2021/106332, filed on Jul. 14, 2021.

(30) Foreign Application Priority Data

Oct. 23, 2020 (CN) .......................... 202011145942.0

(51) Int. Cl.
  *G01R 31/28* (2006.01)
  *G01N 1/32* (2006.01)

(52) U.S. Cl.
  CPC .......... *G01R 31/2898* (2013.01); *G01N 1/32* (2013.01)

(58) Field of Classification Search
  CPC ................ G01R 33/0047; H01L 33/48; H01L 2933/0033
  See application file for complete search history.

(56) References Cited

U.S. PATENT DOCUMENTS

| | | | |
|---|---|---|---|
| 2013/0062760 A1* | 3/2013 | Hung | H01L 23/5389 257/738 |
| 2014/0179032 A1* | 6/2014 | Hasebe | H01L 21/78 438/15 |
| 2021/0057314 A1* | 2/2021 | David | H01L 23/31 |

FOREIGN PATENT DOCUMENTS

| | | |
|---|---|---|
| CN | 1471141 A | 1/2004 |
| CN | 104422606 A | 3/2015 |
| CN | 104465315 A | 3/2015 |
| CN | 105842611 A | 8/2016 |
| CN | 106338684 A | 1/2017 |
| CN | 105990177 B | 1/2019 |
| CN | 110767561 A | 2/2020 |
| EP | 1548450 A2 | 6/2005 |

OTHER PUBLICATIONS

International Search Reportas cited in PCT Application No. PCT/CN2021/106332 dated Oct. 14, 2021, 4 pages.

* cited by examiner

*Primary Examiner* — Tung X Nguyen (74) *Attorney, Agent, or Firm* — Cooper Legal Group, LLC (57) ABSTRACT

Provided is a die extraction method, comprising the following steps: removing solder balls; polishing a front side of the sample to remove a part on a front side of the target die, and retain a part of a die attach film (DAF) layer on the front side of the target die and a bonding wire located in the part; attaching the front side of the sample to the polishing jig and flattening the sample and the polishing jig by the flattener; polishing the back side of the sample to remove a part on a back side of the target die, and retain a DAF layer on the back side of the target die; removing the DAF and a packaging material remaining on the sample to obtain the target die; and attaching the back side of the target die to a glass slide, thus completing extraction of the target die.

15 Claims, 6 Drawing Sheets

DIE EXTRACTION METHOD

CROSS-REFERENCE TO RELATED APPLICATIONS

This application is a continuation application of International Patent Application No. PCT/CN2021/106332, filed on Jul. 14, 2021, which claims priority to Chinese Patent Application No. 202011145942.0, filed with the Chinese Patent Office on Oct. 23, 2020 and entitled "DIE EXTRACTION METHOD". International Patent Application No. PCT/CN2021/106332 and Chinese Patent Application No. 202011145942.0 are incorporated herein by reference in their entireties.

TECHNICAL FIELD

The present disclosure relates to the field of integrated circuit inspection technologies, and in particular to a die extraction method.

BACKGROUND

In an integrated circuit packaging structure, in order to increase a capacity per unit area, packaging is usually performed by stacking dies. At present, in the inspection of the integrated circuit packaging structure, the location of failure hot points can only accurately locate a die at the current layer, and when a die stacked at the lower layer fails, the failure point cannot be located. In order to realize the failure location of the lower-layer die, the electrical properties of a die pad (a circuit board for soldering integrated circuit dies) are detected in cooperation with a probe under a condition that the original electrical properties of the die at the lower layer must be kept unchanged, the die is extracted, and then failure location can be carried out. According to an existing die extraction method, multiple stacked dies are separated by soaking with high-temperature fuming nitric acid for a long time (above 1 h). Due to an ultra-thin thickness (about 50 μm) of the stacked dies, it will lead to problems of die cracking and die pad corrosion, resulting in failure to detect electrical properties. In order to alleviate the above-mentioned problems, although the stacked dies can be polished to the target die at the lower layer to reduce the soaking time, traditional hand-held polishing will still cause a problem of a large step difference (about 30 μm or more) on a surface of a sample.

SUMMARY

One of the main objectives of the present disclosure is to overcome at least one of the above-mentioned drawbacks of a prior art, and to provide a die extraction method that can maintain the integrity of the physical structure of a sample and keep the electrical properties unchanged.

In order to achieve the foregoing objectives, the embodiments of the present disclosure adopt the following technical solution:

According to one aspect of the present disclosure, there is provided a die extraction method for extracting a target die from multiple die layers in an integrated circuit sample, the method including the following steps:

removing solder balls from a back side of the sample;
attaching the back side of the sample to a polishing jig, and flattening the sample and the polishing jig by a flattener;
polishing a front side of the sample to remove a part on a front side of the target die, and retain a part of a die attach film (DAF) layer on the front side of the target die and a bonding wire located in the part;
attaching the front side of the sample to the polishing jig and flattening the sample and the polishing jig by the flattener;
polishing the back side of the sample to remove a part on a back side of the target die, and retain a DAF layer on the back side of the target die;
removing the DAF and a packaging material remaining on the sample to obtain the target die; and
attaching the back side of the target die to a glass slide, thus completing extraction of the target die.

BRIEF DESCRIPTION OF DRAWINGS

By considering the following detailed description of the exemplary embodiments of the present disclosure in conjunction with the accompanying drawings, various objectives, features, and advantages of the present disclosure will become more apparent. The accompanying drawings are only schematic illustrations of the present disclosure, and are not necessarily drawn to scale. In the drawings, like reference numerals refer to the same or similar part. Among the drawings.

REFERENCE NUMERALS 100 sample;
101 reference point;
110 substrate;

111 solder ball;
120 die;
121 target die;
122 bonding wire;
130 DAF;
140 packaging material;
150 polyimide film;
200 polishing jig;
210 hot melt adhesive;
300 flattener;
310 base;
320 pressing plate;
330 pressure sensor.

DESCRIPTION OF EMBODIMENTS

Exemplary embodiments embodying the features and advantages of the present disclosure will be described in detail in the following description. It should be understood that the present disclosure can have various changes in different embodiments, without departing from the scope of the present disclosure, and the descriptions and drawings therein are essentially for illustrative purposes, not to limit the present disclosure.

In the following description of the different exemplary embodiments of the present disclosure, it is made with reference to the accompanying drawings which form a part of the present disclosure and in which different exemplary structures, systems and steps that can implement various aspects of the present disclosure are shown by way of example. It should be understood that other specific solutions of components, structures, exemplary devices, systems, and steps can be used, and structural and functional modifications can be made without departing from the scope of the present disclosure. Moreover, although the terms "above", "between", "within", etc. may be used in this specification to describe different exemplary features and elements of the present disclosure, these terms are used herein for convenience only, for example, according to the directions of the examples described in the drawings. Nothing in this specification should be understood as requiring a specific three-dimensional direction of the structure to fall within the scope of the present disclosure.

Referring FIGS. 1 to 10, schematic structural diagrams of an integrated circuit in multiple steps of a die extraction method according to the present disclosure are respectively shown representatively. In this exemplary embodiment, the die extraction method according to the present disclosure is described using an example of extracting a target die from an integrated circuit packaging structure having a stacked die structure. It is easy for those skilled in the art to understand that, in order to apply the relevant design of the present disclosure to the extraction of die structures of other types of integrated circuits or other processes, various modifications, additions, substitutions, deletions or other changes have been made to the following specific implementations. These changes are still within the scope of the principle of the die extraction method of the present disclosure.

Figure 12:
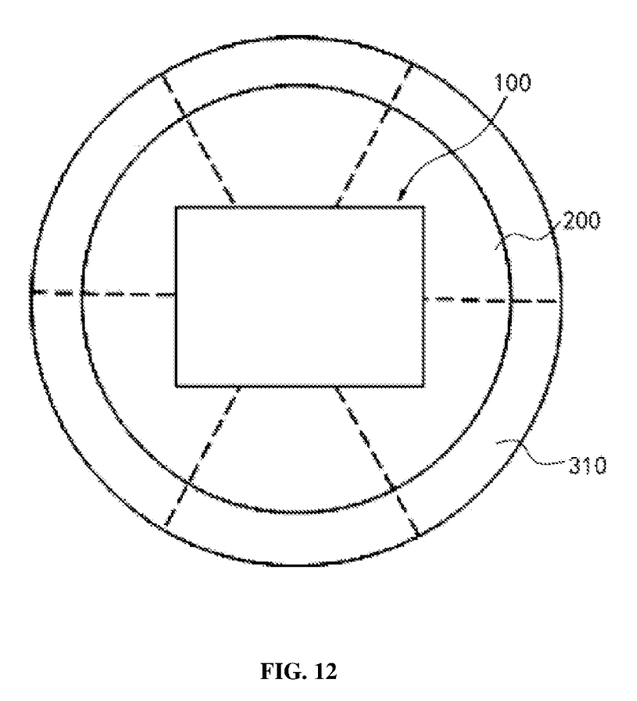
FIG. 12 is a schematic partial top view of FIG. 4.
Figure 13:
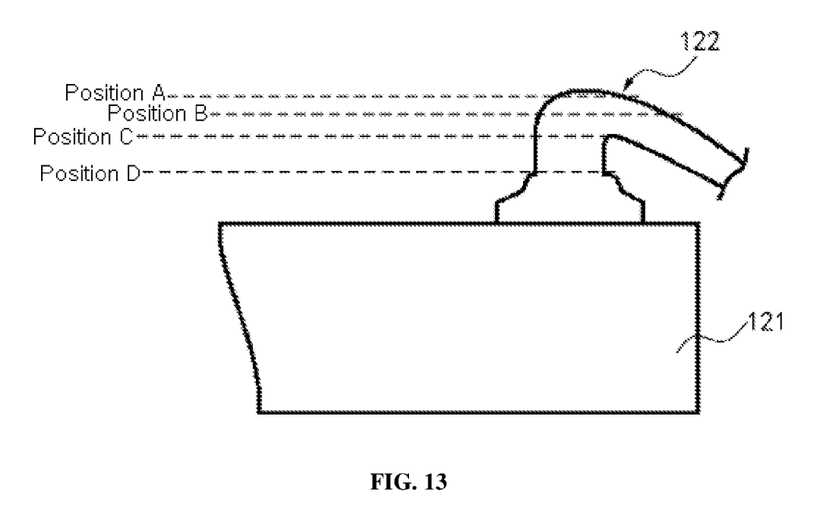
FIG. 13 is a partial enlarged view of an integrated circuit in the step shown in FIG. 5.
Figure 14:
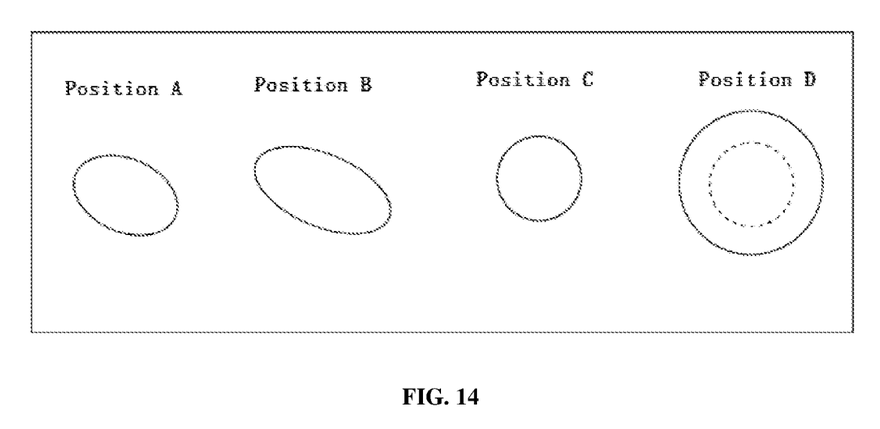
FIG. 14 is a schematic top view of a bonding wire of a target die at multiple stages in the step shown in FIG. 5.

As shown in FIGS. 1 to 10, this embodiment takes the target die 121 which is at a middle layer of multiple stacked die layers 120 as an example for description. In other embodiments, the present disclosure can also be applied to extraction of a die 120 closest to a front side or back side of an integrated circuit packaging structure (hereinafter referred to as the sample 100) from the multiple stacked die layers 120. With reference to FIGS. 11 to 14, FIG. 11 representatively shows a schematic diagram of a back side of an integrated circuit in the step shown in FIG. 2; FIG. 12 representatively shows a schematic partial top view of FIG. 4; FIG. 13 representatively shows a partial enlarged view of an integrated circuit in the step shown in FIG. 5; and FIG. 14 representatively shows a schematic top view of a bonding wire 122 of the target die 121 at multiple stages in the step shown in FIG. 5. In the following, the process, sequence and relationship of the main steps of the die extraction method according to the present disclosure will be described in detail in conjunction with the above-mentioned drawings.

As shown in FIGS. 1 to 10, in this embodiment, the die extraction method according to the present disclosure can extract the target die 121 from the multiple die layers 120 of the integrated circuit sample 100. The die extraction method according to the present disclosure at least includes the following steps:

removing solder balls 111 from a back side of the sample 100;

attaching the back side of the sample 100 to a polishing jig 200, and flattening the sample 100 and the polishing jig 200 by a flattener 300;

polishing a front side of the sample 100 to remove a part on a front side of a target die 121, and retain a part of a DAF layer 130 on the front side of the target die 121 and a bonding wire 122 located in the part;

attaching the front side of the sample 100 to the polishing jig 200, and flattening the sample 100 and the polishing jig 200 by flattener 300;

polishing the back side of the sample 100 to remove a part on the back side of the target die 121, and retain a DAF layer 130 on the back side of the target die 121;

removing the DAF layer 130 and a packaging material 140 remaining on the sample 100 to obtain the target die 121; and attaching the back side of the target die 121 to a glass slide, thus completing extraction of the target die 121.

Based on the foregoing industrial design, in the die extraction method according to the present disclosure, the integrated circuit sample 100 is flatly attached to the polishing jig 200; in cooperation with polishing, a polishing position can stay within a short distance from the target die 121; and by virtue of short-term soaking with an acid-base solution, the target die 121 can be extracted completely with the original electrical properties unchanged, which is contributive to accurate location of a failure point under the assistance of a probe in a consequent inspection process.

Figure 1:
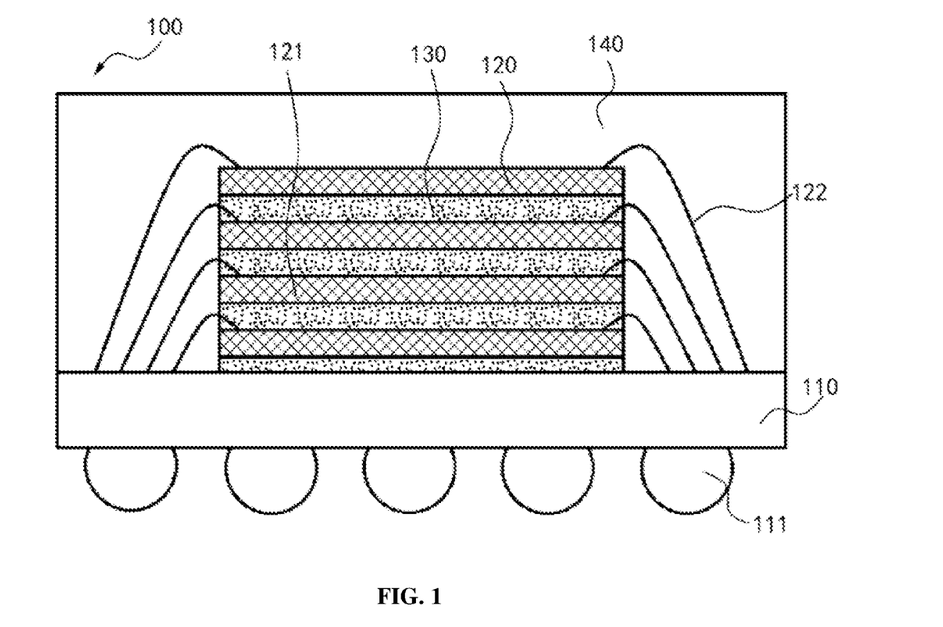
FIG. 1 is a schematic structural diagram of an integrated circuit in a step of a die extraction method according to the present disclosure.

As shown in FIG. 1, FIG. 1 representatively shows a schematic structural diagram of a sample 100 from which a target die 121 is to be extracted. Specifically, the sample 100 includes a substrate 110 (such as a PCB (Printed Circuit Board) substrate), solder balls 111, multiple die layers 120, multiple DAF layers 130, bonding wires 122, and a packaging material 140. The solder balls 111 are arranged on the back side of the substrate 110 (i.e., the back side of the sample 100). The multiple die layers 120 are stacked on the front side of the substrate 110, and two adjacent dies 120 are respectively bonded by a DAF layer 130. The target die 121 to be extracted is at a middle layer of the multiple die layers 120. Each die layer 120 is connected to the front side of the substrate 110 through the bonding wire 122 respectively. The packaging material 140 covers the front side of the substrate 110 and the multiple die layers 120.

Continuing from the above, an existing process for extracting the die 120 is mainly used to deal with the die 120 at the current layer, but cannot locate the failure hot points of the dies 120 at the middle and bottom layers. For the dies 120 at the middle and bottom layers, if the existing extraction process is adopted, during the inspection of the extracted target die 121, since space needs to be reserved for probe inspection, a height difference of about 50 μm between the bonding wire 122 and the surface of the target die 121 in the existing process cannot meet the inspection requirements of the probe.

Figure 2:
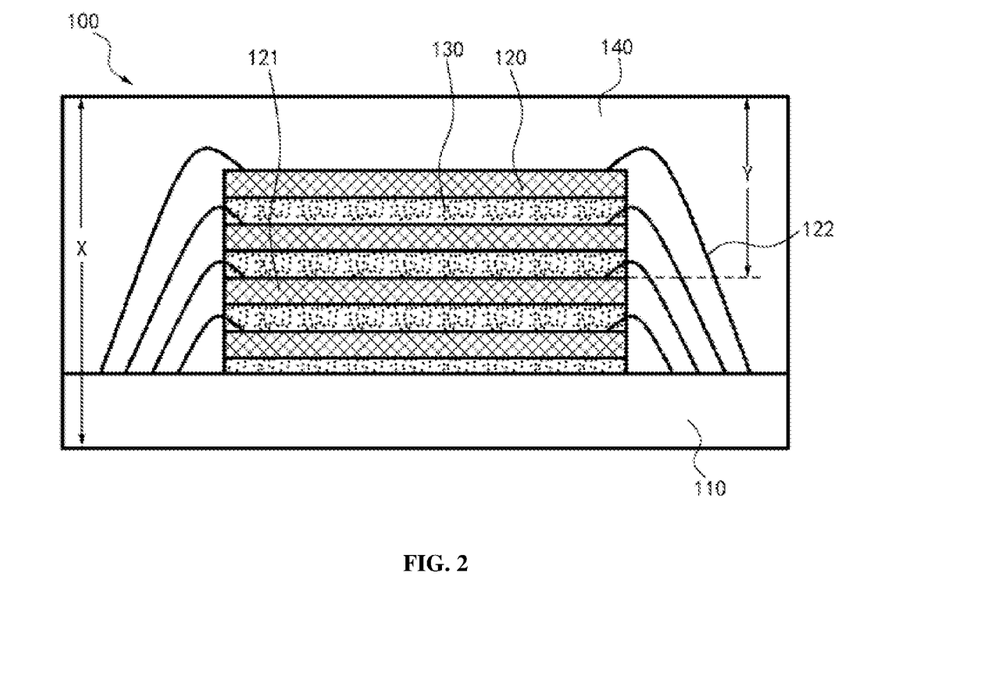
FIG. 2 is a schematic structural diagram of an integrated circuit in a step of a die extraction method according to the present disclosure.

As shown in FIG. 2, FIG. 2 representatively shows a schematic structural diagram of a sample 100 in a step of "removing solder balls 111". Specifically, the sample 100 after the solder balls 111 are removed includes a substrate 110, multiple die layers 120, multiple DAF layers 130, bonding wires 122, and a packaging material 140.

For the step of "removing solder balls 111", in some embodiments, the solder balls 111 can be removed by an electric soldering iron. In other embodiments, the solder balls 111 can also be removed by other processes or devices, and it will not be limited to this embodiment.

Figure 11:
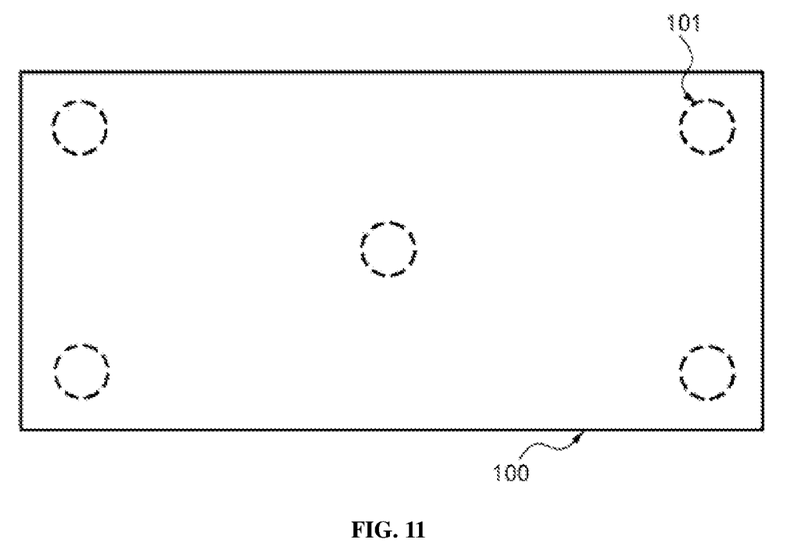
FIG. 11 is a schematic diagram of a back side of an integrated circuit in the step shown in FIG. 2.

As shown in FIG. 11, in some embodiments, after the solder balls 111 are removed, the sample 100 can be flattened, for example, reference points 101 are selected for polishing until a difference in corresponding thickness between any two of the reference points 101 is less than or equal to a third threshold. The third threshold is a thickness difference between points of the sample 100 after the solder balls 111 are removed and the sample 100 is flattened. For details, reference can be made to the process description of flattening the sample 100 in the following other steps. In other embodiments, in order to make the sample 100 after the solder balls 111 are removed more even in thickness and more flat, the number of reference points selected on the surface of the sample can also be less than five, or more than five, and at least two. In addition, the at least two reference points may not include a central reference point located at a geometric center position on the back side of the sample 100, and it will not be limited to this embodiment.

Based on the process design of selecting the reference points on the back side of the sample 100 and polishing the back side of the sample 100 accordingly, in an exemplary embodiment, the third threshold may be within a range of 8 μm to 12 μm, such as 8 μm, 9.5 μm, 11.8 μm, 12 μm, and the like. In other embodiments, the third threshold can also be less than 8 μm, or can be greater than 12 μm, such as 7.9 μm, 12.2 μm, and the like, and is not limited to this embodiment.

As shown in FIG. 11, based on a process design of selecting one central reference point and four edge reference points on the back side of the sample 100, in this embodiment, an example where a cross section of the sample 100 is roughly rectangular, that is, the back side of the sample 100 is roughly rectangular is described, the central reference point can be located at the center of the corresponding rectangle of the back side of the sample 100, and the four edge reference points can be located at four corners on the back side of the sample 100.

Based on the process design of selecting the reference points on the back side of the sample 100 and polishing the back side of the sample 100 accordingly, in this embodiment, in the above-mentioned step of polishing the back side of the sample 100, the back side of the sample 100 can be polished with sandpaper with a particle size of P1500 or more.

Figure 3:
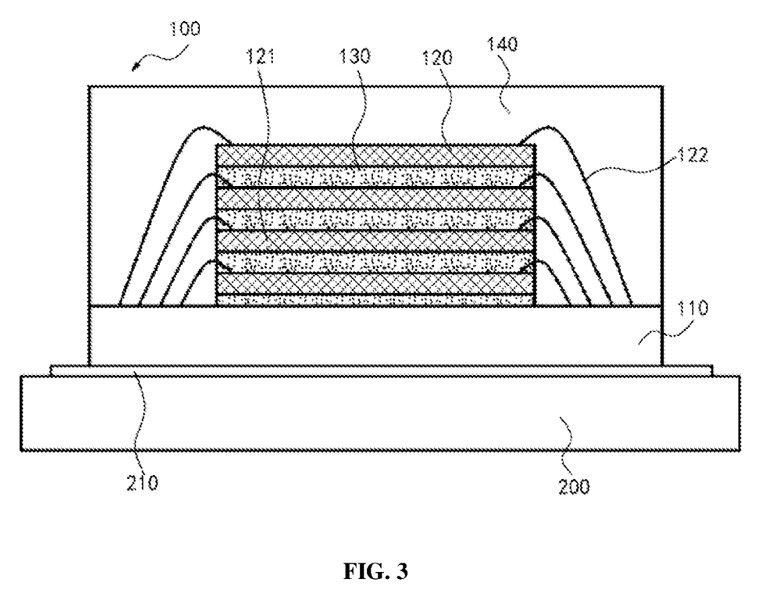
FIG. 3 is a schematic structural diagram of an integrated circuit in a step of a die extraction method according to the present disclosure.

As shown in FIG. 3, FIG. 3 representatively shows a schematic structural diagram of a sample 100 and a polishing jig 200 in a step of "attaching the back side of the sample 100 to the polishing jig 200". Specifically, the back side of the sample 100 attached to the polishing jig 200 includes a substrate 110, multiple die layers 120, multiple DAF layers 130, bonding wires 122, and a packaging material 140. The back side of the sample 100 is attached to the polishing jig 200.

Optionally, as shown in FIG. 3, for the step of "attaching the back side of the sample 100 to the polishing jig 200", in this embodiment, the back side of the sample 100 can be attached to the polishing jig 200 through a hot melt adhesive 210.

Figure 4:
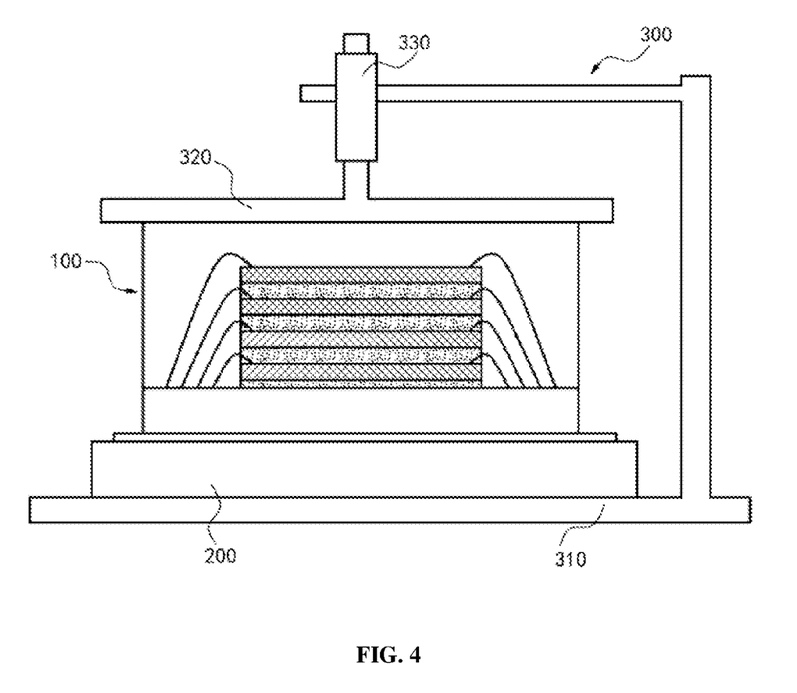
FIG. 4 is a schematic structural diagram of an integrated circuit in a step of a die extraction method according to the present disclosure.

As shown in FIG. 4, FIG. 4 representatively shows a schematic structural diagram of a sample 100, a polishing jig 200 and a flattener 300 in a step of "flattening the sample 100 and the polishing jig 200 by a flattener 300". Specifically, when the back side of the sample 100 is attached to the polishing jig 200, the polishing jig 200 is placed on a base 310 of the flattener 300, a pressure is applied to the front side of the sample 100 many times by a pressing plate 320 of the flattener 300, and the polishing jig 200 is rotated by an angle between two consecutive pressure applications to flatten the sample 100 and the polishing jig 200.

Optionally, as shown in FIG. 12, for the step of "flattening the sample 100 and the polishing jig 200 by the flattener 300", in this embodiment, the polishing jig 200 can rotate by a same angle each time, and the angle the polishing jig 200 rotates each time can be calculated as 360° divided by a number of times of pressure application. For example, the polishing jig 200 can be rotated 6 times, and the angle of each rotation is approximately 60°. In other embodiments, the polishing jig 200 may be rotated more than six times, or less than six times, and at least twice. For example, the polishing jig 200 can be rotated eight times, and the angle the polishing jig 200 rotates each time is approximately 45°. Furthermore, the angle the polishing jig 200 rotates each time may not be completely the same, or may be completely different, and can be flexibly adjusted according to a requirement for flattening the sample 100 and the polishing jig 200, and it will not be limited to this embodiment.

Optionally, as shown in FIG. 12, for the step of "flattening the sample 100 and the polishing jig 200 by the flattener 300", in this embodiment, the pressure applied by the pressing plate 320 to the sample 100 may be within a range of 10 N to 20 N, such as 10 N, 12 N, 15 N, 20 N, and the like. In other embodiments, the pressure applied by the pressing plate 320 to the sample 100 can also be less than 10 N, or can be greater than 20 N, such as 9 N, 22 N, and the like, and it will not be limited to this embodiment.

Optionally, as shown in FIG. 4, a pressure sensor 330 may be arranged on the pressing plate 320 to monitor the pressure applied by the pressing plate 320 to the front side of the sample 100 in real time.

Optionally, as shown in FIG. 12, for the step of "flattening the sample 100 and the polishing jig 200 by the flattener 300", in this embodiment, time of each pressure application by the pressing plate 320 can be within a range of 3 s to 6 s, such as 3 s, 4.5 s, 5.2 s, 6 s, and the like. In other embodiments, the time of each pressure application by the pressing plate 320 can be less than 3 s or can be greater than 6 s, such as 2.8 s, 6.5 s, and the like, and it will not be limited to this embodiment.

Optionally, in this embodiment, after the back side of the sample 100 is attached to the polishing jig 200 and the sample 100 and the polishing jig 200 are flattened by the flattener 300, at least two reference points can be selected on the front side of the sample 100, a corresponding thickness of the sample 100 corresponding to each of reference points is measured by a height measuring device, and a part of the front side of the sample 100 where one, with a relatively large corresponding thickness, of the reference points is located is polished until a difference in the corresponding thickness between any two of the reference points is less than or equal to a second threshold. The second threshold is a thickness difference between the points of the sample 100 flattened by the flattener 300. A specific process for selecting the reference points on the front side of the sample 100 in this step can refer to the following process step of selecting reference points on the back side of the sample 100 and it will not be repeated here.

Based on the process design of selecting the reference points on the front side of the sample 100 and polishing the front side of the sample 100 accordingly, in this embodiment, the second threshold may be within a range of 8 μm to 12 μm, such as 8 μm, 9 μm, 10.7 μm, 12 μm, and the like. In other embodiments, the second threshold can also be less than 8 μm, or can be greater than 12 μm, such as 7.6 μm, 12.1 μm, and the like, and it will not be limited to this embodiment.

Figure 5:
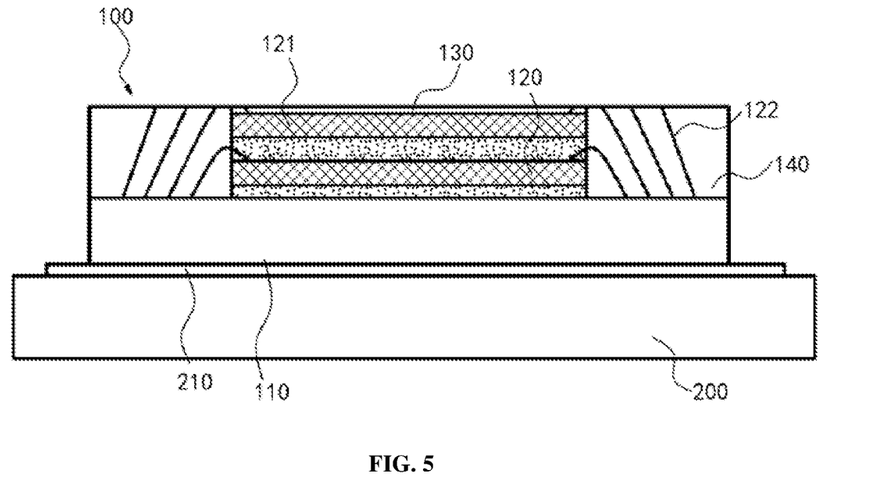
FIG. 5 is a schematic structural diagram of an integrated circuit in a step of a die extraction method according to the present disclosure.

As shown in FIG. 5, FIG. 5 representatively shows a schematic structural diagram of a sample 100 and a polishing jig 200 in the step of "polishing a front side of the sample". Specifically, the sample 100 with the polished front side includes a substrate 110, a remaining part of the die layers 120, a remaining part of the DAF layers 130, a remaining part of the bonding wires 122 and a remaining part of the packaging material 140. The remaining dies 120 include the target die 121 and other die layers 120 located below the target die 121 (i.e., between the target die 121 and the substrate 110). The remaining DAF layer 130 includes the remaining part of a DAF layer 130 on the front side (the side away from the substrate 110) of the target die 121 in addition to the DAF layers 130 located between the remaining adjacent dies 120.

Optionally, for the step of "polishing a front side of the sample 100", in this embodiment, a distance between an end, far away from the target die 121, of the bonding wire 122 retained on the front side of the target die 121 and the target die 121 may be within a range of 5 μm to 20 μm, such as 5 μm, 7.5 μm, 10.5 μm, 20 μm, and the like. The above process design can prevent damage to the probe due to a too long bonding wire 122 or a short circuit caused by the tilt of the adjacent probe, and also can provide a larger area for the application of the probe, thus improving the success rate of the probe. In other embodiments, the distance between the end of the bonding wire 122 retained on the front side of the target die 121 and the target die 121 may also be greater than 20 μm, such as 20.5 μm and the like and it will not be limited to this embodiment.

Based on the design that the distance between the end of the bonding wire 122 retained on the front side of the target die 121 and the target die 121 may be within a range of 5 μm to 20 μm, the distance may preferably be 10 μm in this embodiment. Specifically, the distance of 10 μm is selected in this embodiment because the probe needs to be placed on a pad of the target die 121 for measuring the electrical properties of the pad. For existing pad structures of the die 120, some pads have bonding wires thereon 122 while others do not. Because the probes are thin and a distance between the probes is relatively short, if the bonding wire 122 is too far from the pad, on the one hand the probe may be damaged, and on the other hand, uneven height may cause the probes to connect together and cause a short circuit. In other embodiments, according to the structures of different target die 121 and the structures of different probes, the distance between the end of the bonding wire 122 retained on the front side of the target die 121 and the target die 121 can also be adjusted, but the distance must be greater than or equal to 5 μm for preventing a case where the target die is scratched due to the too short distance during the polishing process.

Optionally, for the step of "polishing the front side of the sample 100", in this embodiment, a thickness of the remaining part of a DAF layer 130 retained on the front side of the target die 121 may be within a range of 5 μm to 20 μm, such as, 5 μm, 7.5 μm, 10.5 μm, 20 μm, and the like. In other embodiments, the thickness of the remaining part of a DAF layer 130 retained on the front side of the target die 121 may also be less than 5 μm, or may be greater than 20 μm, such as 4.8 μm, 20.5 μm, and the like and it will not be limited to this embodiment.

Specifically, for the step of "polishing a front side of the sample 100", in this embodiment, the following steps may be specifically used to polish the front side of the sample 100:

fixing the polishing jig 200 attached to the back side of the sample 100 to a mechanical arm of a polishing machine, and adjusting the polishing jig 200 so that the polishing jig 200 and a polishing disc of the polishing machine are level; and converting a change in pressure value into a distance unit by using a pressure sensor installed on the mechanical arm of the polishing machine, based on which a thickness of a polished part of the front side of the sample 100 is monitored in real time.

When testing a flatness of the sample 100 in the step of "removing the solder balls 111", as shown in FIG. 2, an X value can be measured, and a Y value refers to the thickness of the packaging material 140 of the sample 100 (the thickness of the packaging material 140 covering the die 120 at the top. The Y value is known, and an error is within y (y is, for example, 30 μm). On this basis, the front side of the sample 100 is polished with a piece of 30 μm diamond sandpaper until X−Y+y=Z, then the polishing is stopped, and whether the front side of the sample 100 is polished to a DAF layer 130 on the front side of the target die 121 can be observed under a microscope, for example, it can be distinguished under the microscope according to a color difference (the packaging material 140 and the DAF layer 130 are different in color). The X value refers to the overall thickness of the sample 100, the X value can be obtained by measurement, and the Y value is known because in the packaging process, the thickness of each die 120 and the thickness of each DAF layer 130 are both known. Therefore, according to a number of other die layers and DFA layers above the target die, the thickness of the part, to be removed by polishing, of the sample 100 above the target die 121 can be roughly calculated, and in order to further ensure the reliability of the process, the error y of 30 μm is reserved in this embodiment, that is, an extra thickness of 30 μm is reserved to prevent excessive polishing during the process of polishing the front side of the sample.

The polishing is continued with a piece of 6 μm diamond sandpaper, the polishing is stopped every time the Z value decreases by 3 μm, and a change in the sectional shape of the bonding wire 122 connected to the front side of the target die 121 is observed under a microscope.

The polishing is continued with a piece of 3 μm diamond sandpaper for, for example, 3 s at a polishing speed of, for example, 60 r/s, the polishing is then stopped, and a then shape similar to the sectional shape of the bonding wire 122 at position D in FIG. 14 can be observed under a microscope; at this time, a distance from the front side of the remaining part of the DAF layer 130 to the surface of the target die 121 can be ensured, that is, the thickness of the remaining part of the DAF layer 130 is approximately within a range of 5 μm to 20 μm.

Continuing from the above, as shown in FIG. 13, for the above-mentioned specific steps of polishing the front side of the sample 100, four positions, position A, position B, position C and position D, on the bonding wire 122 connected to the front side of the target die 121 are selected from top to bottom when the bonding wire 122 is close to the target die 121. As the DAF layer 130 is polished during the polishing process, the sectional shapes of the bonding wire 122 corresponding to the above four positions observed under a microscope are not certainly approximated to the four shapes in FIG. 14. Accordingly, the above-mentioned shapes can be observed under a microscope to determine the shape of the remaining part of the bonding wire 122, that is, to assist in determining the thickness of the remaining part of the DAF layer 130.

Optionally, for the step of "polishing a front side of the sample 100", in this embodiment, when the front side of the sample 100 is polished, the thickness of the remaining part of the DAF layer 130 on the front side of the target die 121 can be measured in real time. When the thickness of the remaining part of the DAF layer 130 reaches a threshold, the polishing is stopped. The threshold is the thickness of the remaining part of the DAF layer 130 mentioned above.

Optionally, in this embodiment, after the front side of the sample 100 is polished, the sample 100 may be flattened. For example, five reference points 101 may be selected on the front side of the sample 100, and the five reference points 101 include a central reference point and four edge reference points. The central reference point is located at a geometric center position of the front side of the sample 100, and the edge reference points are located at edge positions of the front side of the sample 100. On this basis, a corresponding thickness of the sample 100 corresponding to each of reference points 101 is measured by a height measuring device, and a part of the front side of the sample 100 where one, with a relatively large corresponding thickness, of the reference points 101 is located is polished until a difference in the corresponding thickness between any two of the reference points 101 is less than or equal to a threshold. The threshold is a thickness difference between the points of the sample 100 having the front side polished during the flattening process. In other embodiments, in order to make the sample 100 having the front side polished more even in thickness and more flat, the number of reference points selected on the surface of the sample can also be less than five, or more than five, and at least two. In addition, the at least two reference points may not include central reference points located at the geometric center position on the front side (or the back side) of the sample 100, and it will not be limited to this embodiment.

Figure 6:
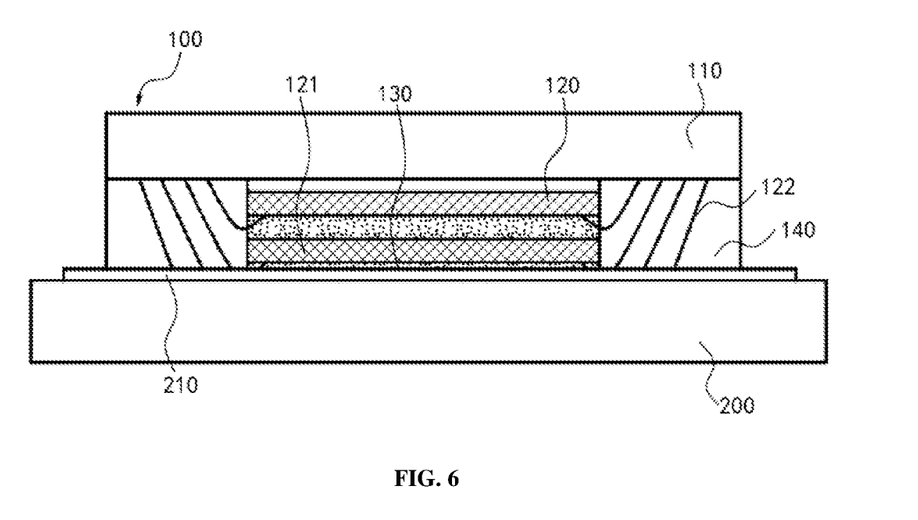
FIG. 6 is a schematic structural diagram of an integrated circuit in a step of a die extraction method according to the present disclosure.

As shown in FIG. 6, FIG. 6 representatively shows a schematic structural diagram of a sample 100 and a polishing jig 200 in a step of "attaching the sample 100 to the polishing jig 200 on the front side". Specifically, the sample 100 attached to the polishing jig 200 on the front side includes a substrate 110, a remaining part of the die layers 120, a remaining part of the DAF layers 130, a remaining part of the bonding wires 122 and a remaining part of the packaging material 140. The sample 100 is attached to the polishing jig 200 on the front surface polished in the foregoing step. That is, the sample 100 is attached to the polishing jig 200 on the back surface; after being flattened by the flattener 300, the front side is polished by polishing equipment; then the sample 100 is removed from the polishing jig 200 and subjected to other leveling treatments; after that, the sample 100 is attached to the polishing jig 200 on the polished front side.

Optionally, as shown in FIG. 6, for the step of "attaching the front side of sample 100 to the polishing jig 200", in this embodiment, the front side of the sample 100 can be attached to the polishing jig 200 through the hot melt adhesive 210.

Optionally, in this embodiment, after the front side of the sample 100 is attached to the polishing jig 200 and the sample 100 and the polishing jig 200 are flattened by the flattener 300, at least two reference points can be selected on the back side of the sample 100, a corresponding thickness of the sample 100 corresponding to each of reference points is measured by a height measuring device, and a part of the back side of the sample 100 where one, with a relatively large corresponding thickness, of the reference points is located is polished until a difference in the corresponding thickness between any two of the reference points is less than or equal to a first threshold. The first threshold is a thickness difference between various positions of the front side of the sample 100 attached to the polishing jig 200. A specific process for selecting the reference points on the back side of the sample 100 in this step can refer to the foregoing process step of selecting the reference points on the sample 100 and it will not be repeated here.

Based on the process design of selecting the reference points on the front side of the sample 100 and polishing the front side of the sample 100 accordingly, in this embodiment, the first threshold may be within a range of 20 μm to 40 μm, such as 20 μm, 25 μm, 32 μm, 40 μm, and the like. In other embodiments, the first threshold can also be less than 20 μm, or can be greater than 40 μm, such as 18 μm, 41 μm, and the like, and it will not be limited to this embodiment.

Figure 7:
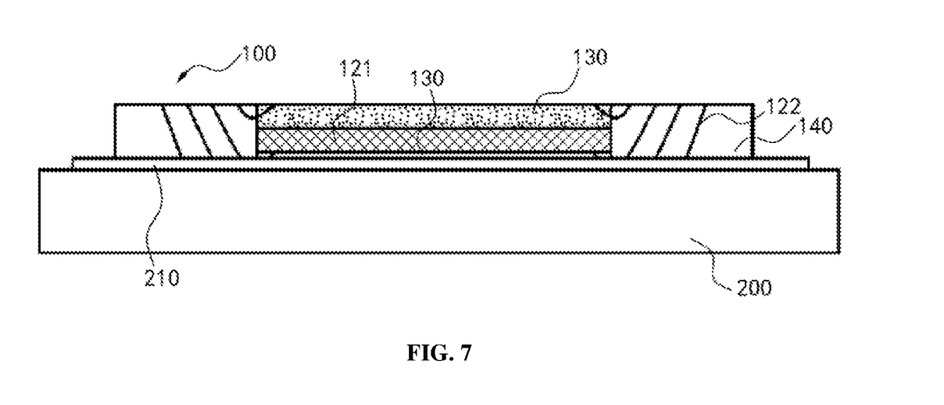
FIG. 7 is a schematic structural diagram of an integrated circuit in a step of a die extraction method according to the present disclosure.
Figure 8:
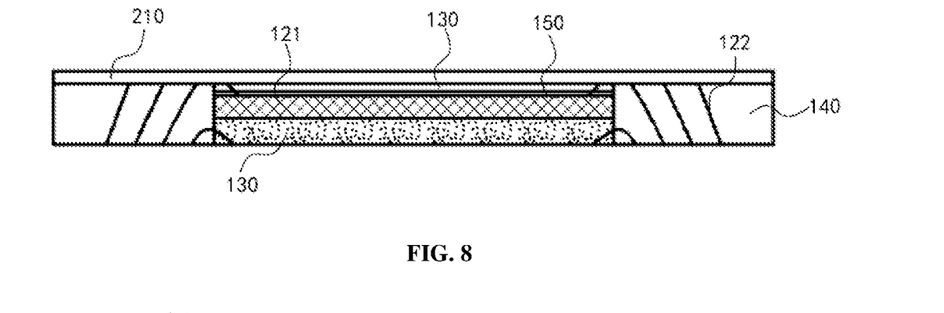
FIG. 8 is a schematic structural diagram of an integrated circuit in a step of a die extraction method according to the present disclosure.

As shown in FIG. 7, FIG. 7 representatively shows a schematic structural diagram of a sample 100 and a polishing jig 200 in the step of "polishing the back side of the sample 100". FIG. 8 shows a schematic structural diagram of a sample 100 having the back side polished after removal from a polishing jig 200. Specifically, the sample 100 having the back side polished includes a target die 121, a DAF layer 130 on a back side of the target die 121, a remaining part of a DAF layer 130 on a front side of the target die 121, a remaining part of a bonding wire 122 connected to the target die 121, and a remaining part of a packaging material 140. In addition, the sample 100 removed from the polishing jig 200 further includes a polyimide film 150 on the front side of the target die 121 (not shown in the aforementioned figures) and a hot melt adhesive 210 remaining on the front side of the sample 100.

It should be noted that after the front side of the sample 100 is polished, the hot melt adhesive 210 attached between the back side of the sample 100 and the polishing jig 200 can be melted by heating, and then the front side of the sample 100 is attached to the polishing jig 200 (polished). During the above process, the sample 100 can be turned over with tweezers. After turning over, the substrate 110 on the back side of the sample 100 will also be polished away. When the back side is polished to expose a DAF layer 130 at the bottom of the sample 100, the polishing can be stopped. The die 120 and the DAF layer 130 can be distinguished because the die 120 and the DAF layer 130 are different in color.

Optionally, for the step of "polishing the back side of the sample 100", in this embodiment, whether the back side of the sample 100 is polished to a DAF layer 130 on the back side of the target die 121 can be observed under a microscope, for example, it can be distinguished under the microscope according to a color difference (the packaging material 140 and the DAF layer 130 are different in color).

Optionally, in this embodiment, after the front side of the sample 100 is polished, the sample 100 can be flattened. For example, a method of selecting reference points on the back side of the sample 100 can be used. For the specific process, reference can be made to the foregoing process steps of selecting reference points on the sample 100, and it will not be repeated here.

Figure 9:
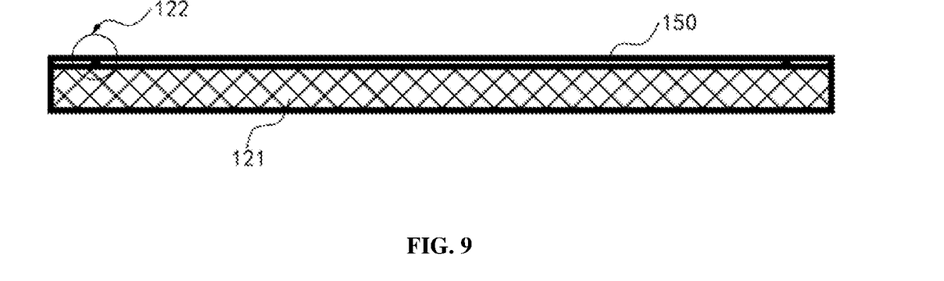
FIG. 9 is a schematic structural diagram of an integrated circuit in a step of a die extraction method according to the present disclosure.
Figure 10:
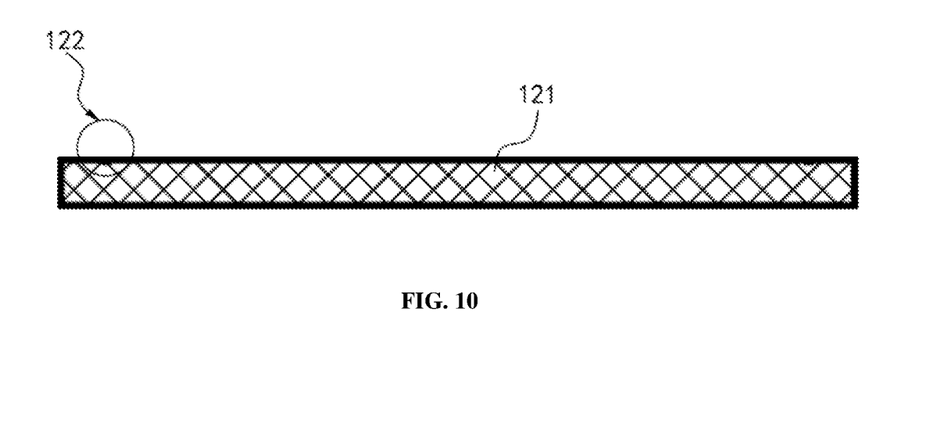
FIG. 10 is a schematic structural diagram of an integrated circuit in a step of a die extraction method according to the present disclosure.

As shown in FIGS. 9 and 10, in this embodiment, the removing the DAF layer 130 and the packaging material 140 remaining on the sample 100 may specifically include the following steps:

soaking the target die 121 with fuming nitric acid to remove the DAF 130 and the packaging material 140 (such as epoxy resin), and also to remove a hot melt adhesive 210 used for attaching the sample 100 to the polishing jig 200;

rinsing the target die 121 with deionized water;

soaking the target die 121 with ethylenediamine to remove the polyimide film 150 from the surface of the target die 121; and rinsing the target die 121 again with deionized water.

As shown in FIG. 9, FIG. 9 representatively shows a schematic structural diagram of the sample 100 in the step of "removing the DAF layer 130 and the packaging material 140". Specifically, the sample 100 having the DAF layer 130 and the packaging material 140 removed includes the target die 121 and the polyimide film 150 remaining on the front side of the target die 121, and further includes a remaining part of a bonding wire 122 connected to the target die 121.

Optionally, for the step of "soaking the target die 121 with fuming nitric acid", in this embodiment, a temperature of the fuming nitric acid may be within a range of 60° C. to 80° C., for example, 65° C., 68° C., 75° C., 80° C., and the like. In other embodiments, the temperature of the fuming nitric acid can also be lower than 60° C., or higher than 80° C., such as 58° C., 81° C., and the like and it will not be limited to this embodiment.

For the step of "soaking the target die 121 with fuming nitric acid", based on the process design that the temperature of the fuming nitric acid is within a range of 60° C. to 80° C., in this embodiment, the temperature of the fuming nitric acid may be 60° C.

Optionally, for the step of "soaking the target die 121 with fuming nitric acid", in this embodiment, the time of soaking with the fuming nitric acid may be within a range of 30 s to 50 s, such as 31 s, 33 s, 41 s, 50 s, and the like. In other embodiments, the time of soaking with the fuming nitric acid can be less than 30 s, or can be more than 50 s, such as 28 s, 51 s, and the like, and it will not be limited to this embodiment.

For the step of "soaking the target die 121 with fuming nitric acid", based on the process design that the time of soaking with the fuming nitric acid is within a range of 30 s to 50 s, in this embodiment, the time of soaking with the fuming nitric acid may be 30 s. Accordingly, due to a short time of contact with an acid-base solution, structures of the pad and the bonding wire will not be corroded, thereby ensuring that the probe can detect the electrical properties of the target die 121.

Optionally, for the step of "rinsing with deionized water the target die 121 soaked with the fuming nitric acid", in this embodiment, the time of rinsing with the deionized water may be more than 10 s, such as 10 s, 11 s, 15 s, 20 s, and the like. In other embodiments, the time of rinsing with the deionized water may also be less than 10 s, such as 9 s, and it will not be limited to this embodiment.

Optionally, for the step of "soaking the target die 121 with ethylenediamine", in this embodiment, a temperature of the ethylenediamine may be within a range of 50° C. to 80° C., such as 55° C., 66° C., 72° C., 80° C., and the like. In other embodiments, the temperature of the ethylenediamine can also be lower than 50° C., or higher than 80° C., such as 49° C., 82° C., and the like and it will not be limited to this embodiment.

For the step of "soaking the target die 121 with ethylenediamine", based on the process design that the temperature of the ethylenediamine is within a range of 50° C. to 80° C., in this embodiment, the temperature of the ethylenediamine may be 50° C.

Optionally, for the step of "soaking the target die 121 with ethylenediamine", in this embodiment, the time of soaking with the ethylenediamine may be within a range of 30 s to 50 s, such as 32 s, 35 s, 42 s, 50 s, and the like. In other embodiments, the time of soaking with the ethylenediamine can be less than 30 s, or can be more than 50 s, such as 29 s, 52 s, and the like, and it will not be limited to this embodiment.

For the step of "soaking the target die 121 with ethylenediamine", based on the process design that the time of soaking with the ethylenediamine is within a range of 30 s to 50 s, in this embodiment, the time of soaking with the ethylenediamine may be 30 s. Accordingly, due to a short time of contact with an acid-base solution, the structure of the pad will not be corroded, thereby ensuring that the probe can detect the electrical properties of the target die 121.

Optionally, for the step of "rinsing with deionized water the target die 121 soaked with the ethylenediamine", in this embodiment, the time of rinsing with deionized water may be more than 10 s, such as 10 s, 13 s, 16 s, 22 s, and the like. In other embodiments, the time of rinsing with deionized water may also be less than 10 s, such as 8 s, and it will not be limited to this embodiment.

Optionally, for the step of "attaching the target die 121 to a glass slide", in this embodiment, the back side of the target die 121 may be attached to the glass slide by a hot melt adhesive. Based on the above process design, during the testing by the probe, the target die 121 can be easily fixed, and a stress acting on the target die 121 by the probe can be relieved.

It should be noted here that the die extraction methods shown in the drawings and described in this specification are only a few examples of many die extraction methods that can adopt the principle of the present disclosure. It should be clearly understood that the principle of the present disclosure is by no means limited to any details or any steps of the die extraction methods shown in the drawings or described in this specification.

In summary, in the die extraction method according to the present disclosure, the integrated circuit sample is flatly attached to the polishing jig; in cooperation with polishing, a polishing position can stay within a short distance from the target die 121; and by virtue of short-term soaking with an acid-base solution, the target die can be extracted completely with the original electrical properties unchanged, which is contributive to accurate location of a failure point under the assistance of a probe in a consequent inspection process.

The exemplary embodiments of the die extraction method according to the present disclosure are described and/or illustrated above in detail. However, the embodiments of the present disclosure are not limited to the specific embodiments described herein. On the contrary, the constituent parts and/or steps of each embodiment can be used independently and separately from other constituent parts and/or steps described herein. Each constituent part and/or step of one embodiment can also be used in combination with other constituent parts and/or steps of other embodiments. During the explanation of the elements/constituent parts/etc. described and/or illustrated herein, the terms such as "one", "a", "the" and the like are intended to mean that there exists one or more elements/constituent parts/etc. The terms "including", "comprising", and "having" are intended to be inclusive and mean that there may be additional elements/constituent parts/etc. other than the listed elements/constituent parts/etc. In addition, the terms "first" and "second" in the claims and specification are used only as marks, and are not numerical limitations on their objects.

Although the die extraction method of the present disclosure has been described according to different specific embodiments, those skilled in the art will appreciate that the implementation of the present disclosure can be modified within the spirit and scope of the claims.

What is claimed is:

1. A die extraction method for extracting a target die from multiple die layers in an integrated circuit sample, the method comprising the following steps:
   removing solder balls from a back side of the integrated circuit sample;
   attaching the back side of the integrated circuit sample to a polishing jig, and flattening the integrated circuit sample and the polishing jig by a flattener;
   polishing a front side of the integrated circuit sample to remove a part on a front side of the target die, and retain a part of a die attach film (DAF) layer on the front side of the target die and a bonding wire located in the part;
   attaching the front side of the integrated circuit sample to the polishing jig and flattening the integrated circuit sample and the polishing jig by the flattener;
   polishing the back side of the integrated circuit sample to remove a part on a back side of the target die, and retain a DAF layer on the back side of the target die;
   removing the DAF and a packaging material remaining on the integrated circuit sample to obtain the target die; and
   attaching the back side of the target die to a glass slide, thus completing extraction of the target die.

2. The die extraction method according to claim 1, wherein in the step of polishing the front side of the integrated circuit sample, a distance between an end, far away from the target die, of the bonding wire retained on the front side of the target die and the target die is within a range of 5 μm to 20 μm.

3. The die extraction method according to claim 1, wherein when the front side of the integrated circuit sample is polished, a thickness of a DAF layer retained on the front side of the target die is within a range of 5 μm to 20 μm.

4. The die extraction method according to claim 1, wherein after the front side of the integrated circuit sample is attached to the polishing jig and the integrated circuit sample and the polishing jig are flattened by the flattener, at least two reference points are selected on the back side of the integrated circuit sample, a corresponding thickness of the integrated circuit sample corresponding to each of the reference points is measured by a height measuring device, and a part of the back side of the integrated circuit sample where one, with a relatively large corresponding thickness, of the reference points is located is polished until a difference in the corresponding thickness between any two of the reference points is less than or equal to a first threshold.

5. The die extraction method according to claim 4, wherein the first threshold is within a range of 20 μm to 40 μm.

6. The die extraction method according to claim 1, wherein the back side of the integrated circuit sample is attached to the polishing jig by a hot melt adhesive.

7. The die extraction method according to claim 1, wherein when the back side of the integrated circuit sample is attached to the polishing jig, the polishing jig is placed on a base of the flattener, a pressure is applied to the front side of the integrated circuit sample a plurality of times by a pressing plate of the flattener, and between two consecutive pressure applications rotated the polishing jig by an angle, in order to flatten the integrated circuit sample and the polishing jig.

8. The die extraction method according to claim 7, wherein at least one of the polishing jig rotates by a same angle each time, and the angle is calculated as 360° divided by a number of times of pressure application; the pressure applied by the pressing plate is within a range of 10 N to 20 N; or time of each pressure application by the pressing plate is within a range of 3 s to 6 s.

9. The die extraction method according to claim 1, wherein after the back side of the integrated circuit sample is attached to the polishing jig and the integrated circuit sample and the polishing jig are flattened by the flattener, at least two reference points are selected on the front side of the integrated circuit sample, a corresponding thickness of the integrated circuit sample corresponding to each of the reference points is measured by a height measuring device, and a part of the front side of the integrated circuit sample where one, with a relatively large corresponding thickness, of the reference points is located is polished until a difference in the corresponding thickness between any two of the reference points is less than or equal to a second threshold.

10. The die extraction method according to claim 9, wherein the second threshold is within a range of 8 μm to 12 μm.

11. The die extraction method according to claim 1, wherein after the solder balls are removed, at least two reference points are selected on the back side of the integrated circuit sample, a corresponding thickness of the integrated circuit sample corresponding to each of the reference points is measured by a height measuring device, and a part of the back side of the integrated circuit sample where one, with a relatively large corresponding thickness, of the reference points is located is polished until a difference in the corresponding thickness between any two of the reference points is less than or equal to a third threshold.

12. The die extraction method according to claim 11, wherein the third threshold is within a range of 8 μm to 12 μm.

13. The die extraction method according to claim 1, wherein the removing the DAF and the packaging material remaining on the integrated circuit sample comprises the following steps:
   soaking the target die with fuming nitric acid to remove the DAF and the packaging material;
   rinsing the target die with deionized water;
   soaking the target die with ethylenediamine to remove a polyimide film from a surface of the target die; and
   rinsing the target die again with deionized water.

14. The die extraction method according to claim 13, wherein at least one of a temperature of the fuming nitric acid is within a range of 60° C. to 80° C.; time of soaking with the fuming nitric acid is within a range of 30 s to 50 s; a temperature of the ethylenediamine is within a range of 50°

C. to 80° C.; time of soaking with the ethylenediamine is within a range of 30 s to 50 s; time of first rinsing with the deionized water is more than 10 s; or time of second rinsing with the deionized water is more than 10 s.

15. The die extraction method according to claim 1, wherein the back side of the target die is attached to the glass slide by a hot melt adhesive.

* * * * *